(12) United States Patent
Then et al.

(10) Patent No.: US 9,461,160 B2
(45) Date of Patent: Oct. 4, 2016

(54) NON-PLANAR III-N TRANSISTOR

(75) Inventors: Han Wui Then, Portland, OR (US);
Robert Chau, Beaverton, OR (US);
Benjamin Chu-Kung, Hillsboro, OR (US); Gilbert Dewey, Hillsboro, OR (US); Jack Kavalieros, Portland, OR (US); Matthew Metz, Portland, OR (US); Niloy Mukherjee, Portland, OR (US); Ravi Pillarisetty, Portland, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 300 days.

(21) Appl. No.: 13/976,837

(22) PCT Filed: Dec. 19, 2011

(86) PCT No.: PCT/US2011/065922
§ 371 (c)(1),
(2), (4) Date: Jun. 27, 2013

(87) PCT Pub. No.: WO2013/095346
PCT Pub. Date: Jun. 27, 2013

(65) Prior Publication Data
US 2013/0277683 A1     Oct. 24, 2013

(51) Int. Cl.
*H01L 29/778*     (2006.01)
*H01L 29/66*      (2006.01)
(Continued)

(52) U.S. Cl.
CPC ..... *H01L 29/7789* (2013.01); *H01L 29/66462* (2013.01); *H01L 29/7786* (2013.01); *H01L 29/785* (2013.01); *H01L 29/2003* (2013.01)

(58) Field of Classification Search
None
See application file for complete search history.

(56) References Cited

U.S. PATENT DOCUMENTS 8,237,151 B2 *  8/2012  Lochtefeld ........ H01L 31/1804
                                                        257/103
8,643,087 B2    2/2014  Sandhu et al.
(Continued)

FOREIGN PATENT DOCUMENTS

| KR | 10-2011-0078507 | 7/2011 |
| TW | 2007-22559 A | 6/2007 |
| TW | 2008-28574 A | 7/2008 |

OTHER PUBLICATIONS

Notice of Preliminary Rejection (Non-Final) from the Korean Intellectual Property Office (KIPA) dated Sep. 17, 2015 for Korean Patent Application No. 10-2014-7013812 and English Summary thereof.
International Search Report and Written Opinion mailed Sep. 7, 2012 for PCT/US2011/065922 filed Dec. 19, 2011, 9 pages.
(Continued)

*Primary Examiner* — Bilkis Jahan
(74) *Attorney, Agent, or Firm* — Blakely, Sokoloff, Taylor & Zafman LLP (57) ABSTRACT

Transistors for high voltage and high frequency operation. A non-planar, polar crystalline semiconductor body having a top surface disposed between first and second opposite sidewalls includes a channel region with a first crystalline semiconductor layer disposed over the first and second sidewalls. The first crystalline semiconductor layer is to provide a two dimensional electron gas (2DEG) within the channel region. A gate structure is disposed over the first crystalline semiconductor layer along at least the second sidewall to modulate the 2DEG. First and second sidewalls of the non-planar polar crystalline semiconductor body may have differing polarity, with the channel proximate to a first of the sidewalls. The gate structure may be along a second of the sidewalls to gate a back barrier. The polar crystalline semiconductor body may be a group III-nitride formed on a silicon substrate with the (10$\bar{1}$0) plane on a (110) plane of the silicon.

10 Claims, 9 Drawing Sheets

(51) Int. Cl.
*H01L 29/78* (2006.01)
*H01L 29/20* (2006.01)

(56) References Cited

U.S. PATENT DOCUMENTS

| | | |
|---|---|---|
| 2003/0116803 A1 | 6/2003 | Park |
| 2005/0116218 A1 | 6/2005 | Yang |
| 2006/0057790 A1 | 3/2006 | Clarke et al. |
| 2007/0148939 A1* | 6/2007 | Chu ............. H01L 21/823807 438/590 |
| 2007/0241399 A1 | 10/2007 | Irisawa et al. |
| 2008/0099845 A1 | 5/2008 | Yang et al. |
| 2008/0142841 A1 | 6/2008 | Lindert et al. |
| 2010/0276669 A1 | 11/2010 | Richter et al. |
| 2011/0024794 A1* | 2/2011 | Ko ................. H01L 29/66795 257/190 |
| 2011/0108850 A1 | 5/2011 | Cheng et al. |

OTHER PUBLICATIONS

Kausik Majumdar et al., HFinFET: A Scalable, High Performance, Low Leakage Hybrid n-Channel FET, IEEE Transactions on Nanotechnology, vol. 9, No. 3, May 2010, pp. 342-344.
German Office Action from the German Patent and Trademark Office dated Sep. 7, 2015 for German Patent Application No. 11 2011 105 987.6 and English Translation thereof.
Notice of Preliminary Rejection (Non-Final) from the Korean Intellectual Property Office (KIPA) dated Feb. 23, 2016 for Korean Patent Application No. 10-2014-7013812 and English Summary thereof.
V.V. Kuryatkov et al., "GaN Stripes on Vertical {111} Fin Facets of (110)-Oriented Si Substrates", Applied Physics Letters 96, 073107, 2010 American Institute of Physics, 4 pages.
Office Action including Search Report from the Taiwan Examiner of the Intellectual Property Office (the IPO) dated May 17, 2016 for Taiwan Patent Application No. 104124535 and English Summary thereof.

* cited by examiner

NON-PLANAR III-N TRANSISTOR

CROSS-REFERENCE TO RELATED APPLICATION

This application is a U.S. National Phase application under 35 U.S.C. §371 of International Application No. PCT/US2011/065922, filed Dec. 19, 2011, entitled NON-PLANAR III-N TRANSISTOR.

TECHNICAL FIELD

Embodiments of the present invention generally relate to microelectronic fabrication and more particularly to non-planar group III-nitride transistors.

BACKGROUND

Systems on a chip (SOC) have been implemented in a number of capacities over the last few decades. SOC solutions offer the advantage of scaling which cannot be matched by board-level component integration. While analog and digital circuits have long been integrated onto a same substrate to provide a form of SOC that provides mixed signal capabilities, SOC solutions for mobile computing platforms, such as smart phones and tablets, remain elusive because these devices typically include components which operate with two or more of high voltage, high power, and high frequency. As such, conventional mobile computing platforms typically utilize group III-V compound semiconductors, such a GaAs heterojunction bipolar transistors (HBTs), to generate sufficient power amplification at GHz carrier frequencies, and laterally diffused silicon MOS (LDMOS) technology to manage voltage conversion and power distribution (battery voltage regulation including step-up and/or step-down voltage conversion, etc.). Conventional silicon field effect transistors implementing CMOS technology is then a third device technology utilized for logic and control functions within a mobile computing platform.

The plurality of transistor technologies utilized in a mobile computing platform limits scalability of the device as a whole and is therefore a barrier to greater functionality, higher levels of integration, lower costs, and smaller form factors, etc. While an SOC solution for the mobile computing space that would integrate two or more of these three device technologies is therefore attractive, one barrier to an SOC solution is the lack of a scalable transistor technology having both sufficient speed (i.e., sufficiently high gain cutoff frequency, $F_t$), and sufficiently high breakdown voltage (BV).

One promising transistor technology is based on group III-nitrides (III-N). However, this transistor technology faces fundamental difficulties in scaling to feature sizes (e.g., gate length) less than 100 nm where short channel effects become difficult to control. Scaled III-N transistors with well-controlled short channel effects are therefore important to achieving high $F_t/F_{max}$, with sufficiently high breakdown voltage (BV). For an SOC solution to deliver the product specific electrical current and power requirements of a mobile computing platform, fast switching high voltage transistors capable of handling high input voltage swings and providing high power added efficiencies at RF frequencies are needed. An advanced III-N transistor amenable to scaling and such performance is therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Figure 1A:
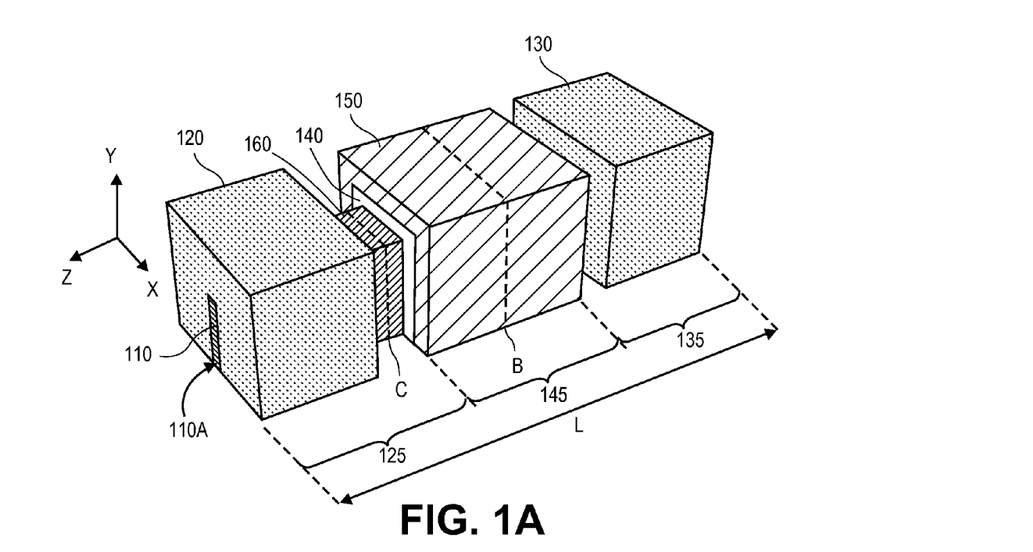
FIG. 1A is a isometric illustration of a non-planar III-N transistor, in accordance with an embodiment.
Figure 1B:
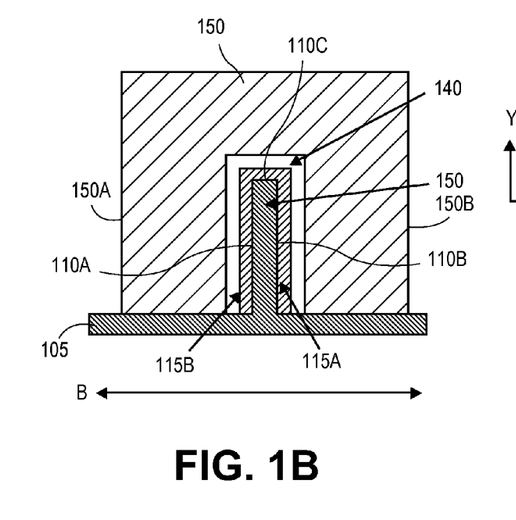
FIG. 1B is a transverse cross-sectional illustration of the non-planar III-N transistor depicted in FIG. 1A through a plane B, in accordance with an embodiment.
Figure 1C:
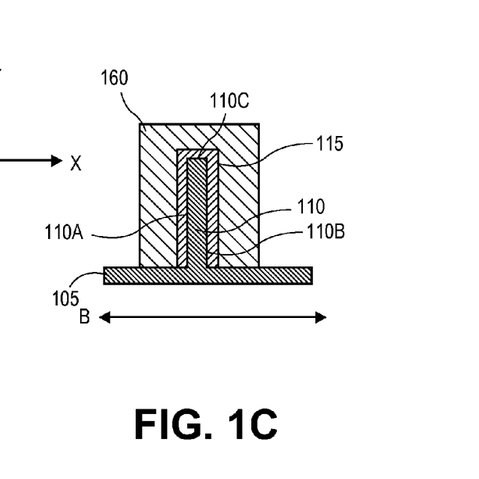
FIG. 1C is a transverse cross-sectional illustration of the non-planar III-N transistor depicted in FIG. 1A through a plane C, in accordance with an embodiment.

FIG. 1A is an isometric illustration of a non-planar group III-nitride transistor 100, in accordance with an embodiment. FIG. 1B is a cross-sectional illustration of the non-planar group III-nitride transistor 100A on a plane B passing through a channel region, in accordance with an embodiment. FIG. 1C is a cross-sectional illustration of the non-planar group III-nitride transistor 100 through a plane C passing through an extrinsic region, in accordance with an embodiment. Generally, the non-planar group III-nitride transistor 100 includes a non-planar, polar crystalline semiconductor body 110 having a top surface 110C disposed between first and second opposite sidewalls, 110A and 110B extending from a bulk polar crystalline semiconductor layer 105 (FIG. 1B). While the non-planarity of the body 110 may resemble a "fin" structure which has become popular in silicon technology, as described further herein, unlike a silicon finFET, the non-planar group III-nitride transistor 100 is a device wherein the polarity of the atomic bonds within crystalline semiconductor body 110 render embodiments of the non-planar group III-nitride transistor 100 "asymmetrical." This asymmetry is manifested primarily in the channel region, which is proximate to one of the first or second opposite sidewalls, 110A/110B even though the mechanical structure of the non-planar body 110 and overlying layers are substantially symmetrical about a longitudinal centerline of the non-planar, polar crystalline semiconductor body 110 (i.e., along the z-axis).

The non-planar, polar crystalline semiconductor body 110 is substantially single crystalline though a low level of crystal defects may be present as artifacts of an imperfect epitaxial growth process. The relevant characteristic however is that the semiconductor body 110 has much greater long range order than a polycrystalline material. In the exemplary embodiment, the polar semiconductor crystalline body 110 is of gallium nitride (GaN) through in other embodiments may be of any group III-nitride, such as, but not limited to: aluminum nitride (AlN), indium nitride (InN), ternary alloys thereof, such as aluminum indium nitride ($Al_xIn_{1-x}N$) and aluminum gallium nitride ($Al_xGa_{1-x}N$), where x is less than 1.

The non-planar, polar crystalline semiconductor body 110 may take many forms from a conventional trigate geometry where the top surface 110C defines a fin "width" that is approximately equal to the fin "height" defined by the first and second opposite sidewalls 110A, 110B (FIG. 1B) to a multi-gate geometry where the top surface 110C defines a fin width that is significantly smaller than the fin height. While a fin height that is significantly smaller than the fin width is also possible, as described further herein, because of the location of the channel, the fin height:width aspect ratio is preferably 1:1, or more. For the exemplary GaN embodiment, the width of the polar crystalline semiconductor body 110 is between 5 and 10 nanometers (nm) and the height of the polar crystalline semiconductor body 110 is between 25 and 50 nm. As describe further elsewhere herein, in certain embodiments the channel width is therefore on the order of 50 nm because of the asymmetry of the channel region.

As further illustrated in FIG. 1A, a longitudinal length L of the non-planar group III-nitride transistor 100 is divided between extrinsic regions 125, 135 and a channel region 145 there between. Noting again that one of the advantages of the non-planar group III-nitride transistor 100 is its scalability, it is expected that dimensions of the polar crystalline semiconductor body 110 can remain on par with those of a conventional silicon finFET, as determined by a longitudinal length of the channel region 145, which may be significantly less than 100 nm to achieve an improvement in scaling beyond a planar device.

In the exemplary embodiment, the extrinsic region 125, at a first end of the polar crystalline semiconductor body 110, includes a length of the polar crystalline semiconductor body 110 upon which the source region 120 is formed and a length of the polar crystalline semiconductor body 110 which spaces apart the source region 120 from the channel region 145. Similarly, the extrinsic region 135, at a second end of the polar crystalline semiconductor body 110, includes a length of the polar crystalline semiconductor body 110 upon which the drain region 130 is formed and a length of the polar crystalline semiconductor body 110 which spaces apart the drain region 130 from the channel region 145. The source and drain regions 120, 130, may in an alternative embodiment, abut opposite end faces (e.g., 110A in FIG. 1A) of the polar crystalline semiconductor body 110 with the longitudinal length L of the non-planar group III-nitride transistor 100 thereby reduced by the lengths of the source region 120 and drain 130.

The source region 120 and drain region 130 may include as-grown highly doped N+ group III-nitride semiconductor layers, or an alternate N+ doped semiconductor material, and may further include metallization over the highly doped semiconductor layer(s) to provide low contact resistance. In one embodiment, a graded group III-nitride semiconductor layer is grown over end portions of the extrinsic regions 125, 135. For example, in one embodiment employing a polar crystalline semiconductor body 110 of GaN, a low band gap III-N such as $In_xGa_{1-x}N$ grades from GaN to InN. Depending on the fabrication technique, such regrown extrinsic regions may be formed prior to formation of a gate structure (e.g., regrown source drain regions are removed from channel region during gate formation), or preferably, the channel region is protected (e.g., either by a place holding dummy gate structure that will subsequently be replaced with the gate structure or protected by the final gate structure itself).

As shown in FIGS. 1A and 1B, over the channel region 145 is a gate structure to modulate a channel within the polar crystalline semiconductor body 110. In embodiments the gate structure includes a conductive gate (electrode) material layer 150 along at least the second sidewall 110B. In the exemplary embodiment the conductive gate (electrode) material layer 150 is also disposed along the first sidewall 110A in a manner symmetrical with the second sidewall 110B. Generally, the conductive gate material 150 may include one or more of any material known in the art for gate electrodes. In an embodiment, the gate material 150 includes a work function metal which may be selected to obtain a desired threshold voltage ($V_t$) (e.g., greater than 0V, etc). Exemplary conductive gate materials include, tungsten (W), aluminum (Al), titanium (Ti), tantalum (Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

In the exemplary embodiment, the conductive gate material 150 is electrically isolated from the polar crystalline semiconductor body 110 by a gate dielectric material 140 disposed under the conductive gate material 150 to reduce leakage current between the conductive gate material 150 and the polar crystalline semiconductor body 110. Generally, the gate dielectric material 140 may include one or more of any material known in the art for gate dielectrics, as is preferably a high K dielectric (i.e., having a dielectric constant greater than that of silicon nitride ($Si_3N_4$)), such as, but not limited to, high K oxides like gadolinium oxide ($Gd_2O_3$), hafnium oxide ($HfO_2$), high K silicates such as HfSiO, TaSiO, AlSiO, and high K nitrides such as HfON.

Below the gate structure along the channel region 145, the polar crystalline semiconductor body 110 is covered with a first crystalline semiconductor layer 115 disposed over the first and second sidewalls 110A and 110B, as well as over the top surface 110C. In the exemplary embodiment, the first crystalline semiconductor layer 115 is disposed directly on the polar crystalline semiconductor body 110 along both first and second sidewalls 110A and 110B. The composition of the first crystalline semiconductor layer 115 is different than that of the polar crystalline semiconductor body 110 so as to form a heterointerface. Preferably, the first crystalline semiconductor layer 115 is substantially monocrystalline (i.e., having a thickness below the critical thickness) and lattice matched to the polar crystalline semiconductor body 110. Depending on the composition of the first crystalline semiconductor layer 115, more or less tensile and/or compressive strain may be induced in one or more of the first crystalline semiconductor layer 115 and the polar crystalline semiconductor body 110.

Generally, the first crystalline semiconductor layer 115 is to be of a group III-nitride material having a wider band gap than that of the polar crystalline semiconductor body 110 so as to form a quantum-well within the polar crystalline semiconductor body 110. For the sake of lattice match, the first crystalline semiconductor layer 115 is ideally a group III-nitride. In the exemplary embodiment where the polar semiconductor crystalline body 110 is of gallium nitride (GaN), the first crystalline semiconductor layer 115 is AlN. In other embodiments, where the polar semiconductor crystalline body 110 is of gallium nitride (GaN) or another of the materials provided herein, the first crystalline semiconductor layer 115 is a ternary alloy, such as aluminum indium nitride ($Al_xIn_{1-x}N$) and aluminum gallium nitride ($Al_xGa_{1-x}N$). In still other embodiments, the first crystalline semiconductor layer 115 is a quarternary alloy, such as $In_xGa_yZn_{1-x-y}O$, or a group IV-nitride, such as ($Si_xN$) although the concomitant change to the heterointerface may be expected to change the characteristics of the non-planar group III-nitride transistor 100 considerably.

Figure 2A:
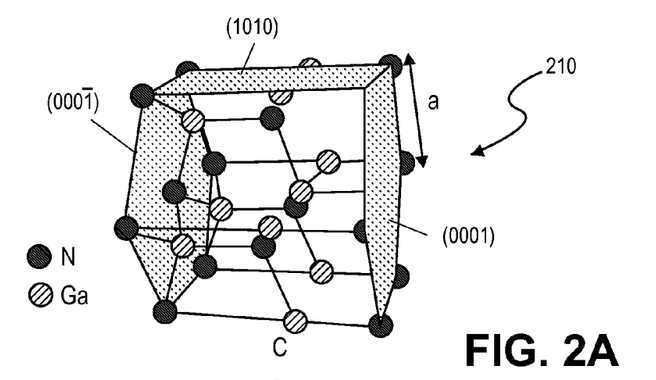
FIG. 2A illustrates a III-N semiconductor crystal polarity, in accordance with an embodiment.

Though the first crystalline semiconductor layer 115 is present in substantially the same amount along both of the first and second sidewalls 110A and 110B, the first crystalline semiconductor layer 115 serves at least two functions within the non-planar group III-nitride transistor 100 as a result of the asymmetry induced by the polar bonds within the semiconductor crystalline body 110 and the polarization direction stemming from these bonds with respect to the first crystalline semiconductor layer 115. FIG. 2A illustrates a group III-nitride crystal structure 210 which is utilized in embodiments of the semiconductor crystal body 110, as further illustrated in cross-section by FIG. 2B. Generally, the group III-nitride crystal structure 210 is known as the wurtzite structure. GaN and other group III-nitrides described herein may be formed with the wurtzite structure which is notable in that it is non-centrosymmetric meaning that the crystal lacks inversion symmetry, and more particularly the {0001} planes are not equivalent. For the exemplary GaN embodiment, one of the {0001} planes is typically referred to as the Ga-face (+c polarity) when and the other referred to as the N-face (−c polarity). Often for planar group III-N devices, one or the other of {0001} planes is more proximate a substrate surface and so may be referred to as Ga polarity (+c) if the three bonds of the Ga (or other group III element) point towards the substrate or N polarity (−c) if the three bonds of the Ga (or other group III element) point away from the substrate. For embodiments of the non-planar group III-N transistor 100 however, the wurtzite crystal orientation is such that the ($10\bar{1}0$) plane having lattice constant c forms a top surface of the crystal and interfaces whatever substrate was used to grow the group III-nitride.

Figure 2B:
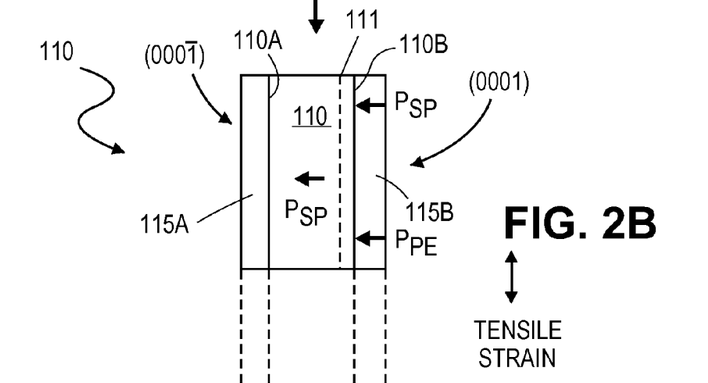
FIG. 2B illustrate transverse across-sectional view of non-planar crystalline semiconductor body having the III-N semiconductor crystal polarity illustrated in FIG. 2A, in accordance with an embodiment.

In embodiments, the non-planar polar semiconductor crystalline body 110 is oriented with respect to the group III-nitride crystal structure 210 as further illustrated by FIG. 2B. As shown, the first sidewall 110A is substantially along the ($000\bar{1}$) plane such that the majority of the surface of the first sidewall 110A is defined by the ($000\bar{1}$) plane. Similarly, the second sidewall 110B is substantially along the (0001) plane such that the majority of the surface of the second sidewall 110B is defined by the (0001) plane. The spontaneous polarization field, $P_{SP}$ within the non-planar polar semiconductor crystalline body 110 is therefore directed from the second sidewall 110B to the first sidewall 110A. As such, the polarization of the non-planar group III-N transistor 100 is through the width of the polar semiconductor crystalline body 110, laterally along the x-dimension, rather than vertically through the body thickness along the y-dimension. In other words, the non-planar transistor 100 is oriented substantially orthogonal to that of a typical planar device.

With the first crystalline semiconductor layer 115 disposed over the non-planar polar semiconductor crystalline body 110, the crystal orientation of the first crystalline semiconductor layer 115 is also with the group III-nitride crystal structure 210 with the same crystal orientation as that of the body 110. The first crystalline semiconductor layer 115 also has a spontaneous polarization field, $P_{SP}$ aligned with that of the body 110. Furthermore, when the first crystalline semiconductor layer 115 is under tensile strain in a direction parallel to the height dimension of the sidewalls 100A, 110B (along y-dimension as shown in FIG. 2B), a piezoelectric polarization field $P_{PE}$ is also aligned with $P_{SP}$ in a direction from the second sidewall 110B to the first sidewall 110A. The polarizations of the non-planar polar semiconductor crystalline body 110 and the first crystalline semiconductor layer 115 form a polarization field at the heterointerface along the (0001) plane proximate to the second sidewall 110B. As described by Maxwell's equations, the polarization field induces a sheet charge [two dimensional electron gas (2DEG)] 111 proximate to this heterointerface. Along the second sidewall 110B therefore, the first crystalline semiconductor layer 115 induces channel charge within the polar crystalline semiconductor body 110 to provide the 2DEG 111.

Along the first sidewall 110A, the first crystalline semiconductor layer 115 serves as a back barrier at the (000$\bar{1}$) plane of the polar crystalline semiconductor body 110 that confine carriers to within the polar crystalline semiconductor body 110. As such, channel width is approximately equal to the height of the polar crystalline semiconductor body 110 (e.g., 50 nm). Whereas in a planar architecture, high band gap epitaxial layers must be inserted below a channel region (layer), degrading the channel layer due to growth interruptions, because the first crystalline semiconductor layer 115 wraps around the polar crystalline semiconductor body 110, the first crystalline semiconductor layer 115 may be formed by regrowth after the polar crystalline semiconductor body 110 is delineated in the non-planar body. As such, the back barrier at the (000$\bar{1}$) plane of the polar crystalline semiconductor body 110 may be formed without degrading the channel region. In the exemplary embodiment depicted in FIGS. 1A and 1B, where the gate structure includes the conductive gate material 150 along the first sidewall 110A, the back barrier becomes a gated back barrier for greatly enhanced control of short channel effects (SCE), thereby enabling scaling of the non-planar group III-N transistor. Indeed, it has been found that a gated back barrier at nanometer separation from the channel provides the necessary electrostatic control to achieve excellent short channel performance.

Figure 2C:
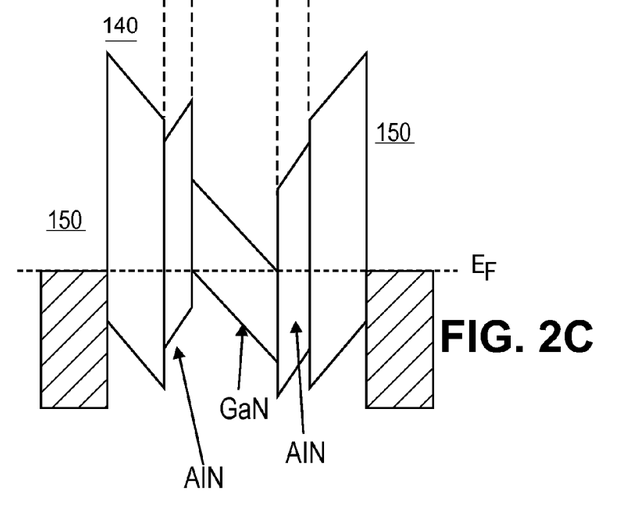
FIG. 2C is a band diagram of a non-planar high group III-nitride transistor formed from the non-planar crystalline semiconductor body illustrated in FIG. 2B, in accordance with an embodiment.

FIG. 2C is a band diagram of a non-planar group III-nitride transistor formed from the non-planar crystalline semiconductor body illustrated in FIG. 2B, with the wrap around gate structure as illustrated in FIG. 1A, in accordance with the exemplary embodiment where the polar crystalline semiconductor body 110 is GaN and the first crystalline semiconductor layer 115 is AlN. As shown in FIG. 2C, at zero gate bias the bands are asymmetrical across the cross-sectional width of the non-planar body 110 and between the first crystalline semiconductor layer 115A disposed on the first sidewall 110A and the first crystalline semiconductor layer 115B disposed on the second sidewall 110B. At the location within the non-planar body 110 where the band bends below the Fermi level $E_F$ from the polarization field, charge carriers are present. As illustrated by the band diagram, the symmetrical gate structure illustrated in FIG. 1B has an asymmetrical function arising from the polarity of the non-planar crystalline body 110. With the 2DEG 111 proximate to the second sidewall 110B, the conductive gate layer portion 150A (FIG. 2B) proximate to the second sidewall 110B modulates the charge carrier density of the 2DEG 111 within the channel region while the conductive gate layer portion 150B proximate to the first sidewall 110A modulates the back barrier.

Figure 2D:
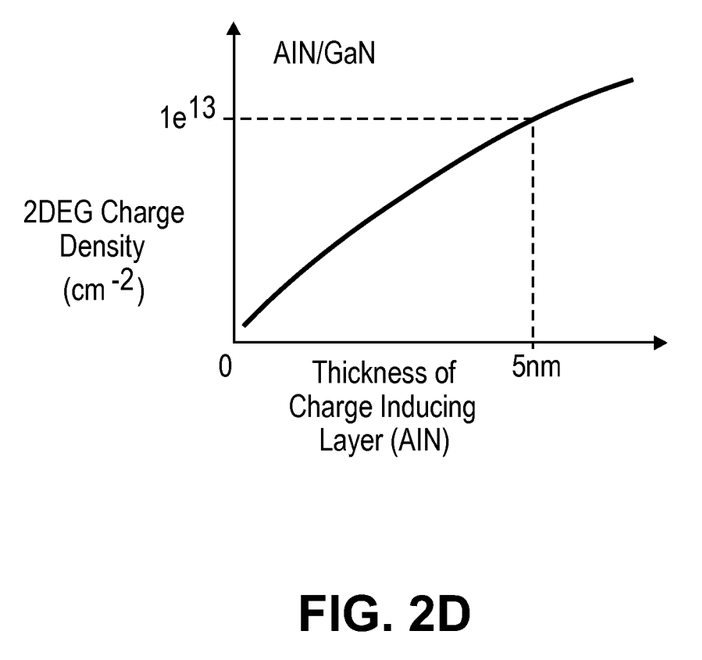
FIG. 2D is a graph of charge density with a channel region of the HEMT illustrated in FIG. 2A as a function of a charge inducing layer thickness, in accordance with an embodiment of the present invention.

Generally, the thickness of the first crystalline semiconductor layer 115 along the second sidewall 110B controls the channel charge (i.e., charge density of the 2DEG 111) at zero gate bias. Threshold voltage ($V_t$) control is therefore a function the first crystalline semiconductor layer 115 thickness. As the first crystalline semiconductor layer 115 may be an epitaxially grown film, very precise control of the layer thickness (and therefore $V_t$) is possible. As further illustrated in FIG. 2D, the 2DEG charge density increases with increasing thickness of the charge inducing layer (i.e., the first crystalline semiconductor layer 115 along the second sidewall 110B) because of the greater resulting polarization field. Indeed, in a particular embodiment without any impurity doping in the polar non-planar crystalline body 110 or remote delta doping (e.g., within the first crystalline semiconductor layer 115), large 2DEG charge densities are still achievable thereby advantageously providing high electron mobility. For example, in the exemplary embodiment where the crystalline semiconductor layer 115 is undoped AlN and the polar non-planar crystalline body 110 is undoped GaN, a sheet charge density on the order of $1e^{13}$ cm$^{-2}$ can be achieved with an AlN thickness of approximately 5 nm. Because bulk mobility is greatly diminished with dopant scattering and 2DEG mobility can be more than four times the bulk mobility (e.g., 2000 cm$^2$/s for undoped GaN), the ability to control $V_t$ and provide adequate sheet charge density via the first crystalline semiconductor layer 115 thickness enables the non-planar group III-nitride transistor 100 to operate as a high electron mobility transistor (HEMT). Depending on the implementation, therefore, the thickness of the first crystalline semiconductor layer 115B (along at least the second sidewall 110B) is between approximately 1 nm and approximately 10 nm, and is more particularly between 1 nm and 4 nm for scaled transistors requiring the greatest degree of back barrier gating. Where a conventional unmasked regrowth forms the first crystalline semiconductor layer 115, the back barrier (115A) is approximately the same thickness as it is along the second sidewall 110B.

As further shown in FIG. 1C, within the extrinsic regions 125 and 135, between the source, drains 120, 130 and the channel region 145, a second crystalline semiconductor layer 160 is disposed on the non-planar polar crystalline semiconductor body 110. Generally, the second crystalline semiconductor layer 160 is to serve as a charge inducing layer and because there is no back gate in the extrinsic regions, the charge inducing layer may be as thick as desired to enable attainment of the charge density desired to reduce the external resistances ($R_{ext}$) linking the drain region 130 to the channel region 145 (and also source region 120 to the channel region 145 in certain embodiments). In an embodiment, the second crystalline semiconductor layer 160 is therefore either a different material and/or a different thickness than the first crystalline semiconductor layer 115, though it is still preferably to be lattice matched to the non-planar polar crystalline semiconductor body 110. Such differentiation between the extrinsic region 135 (125) and the channel region 145 is possible because regrowth of the first and second crystalline semiconductor layers 115 and 160 may be done selectively to each other. For example, one or the other of the first and second crystalline semiconductor layers 115 and 160 may be regrown on the non-planar polar crystalline semiconductor body 110 first (e.g., second crystalline semiconductor layer 160) while the another region of non-planar polar crystalline semiconductor body 110 is protected by sacrificial mask (e.g., channel region 145 protected by a sacrificial gate placeholder structure). Then the first regrown crystalline semiconductor layer is protected (e.g., with a source and drain metallization) while the other crystalline semiconductor layer is regrown on the non-planar polar crystalline semiconductor body 110 (e.g., first crystalline semiconductor layer 115). A similar technique may be utilized to produce the exemplary extrinsic region 135 illustrated in FIG. 1C, having both the first crystalline semiconductor layer 115 and the second crystalline semiconductor layer 160 disposed over the first crystalline semiconductor layer 115.

Figure 3:
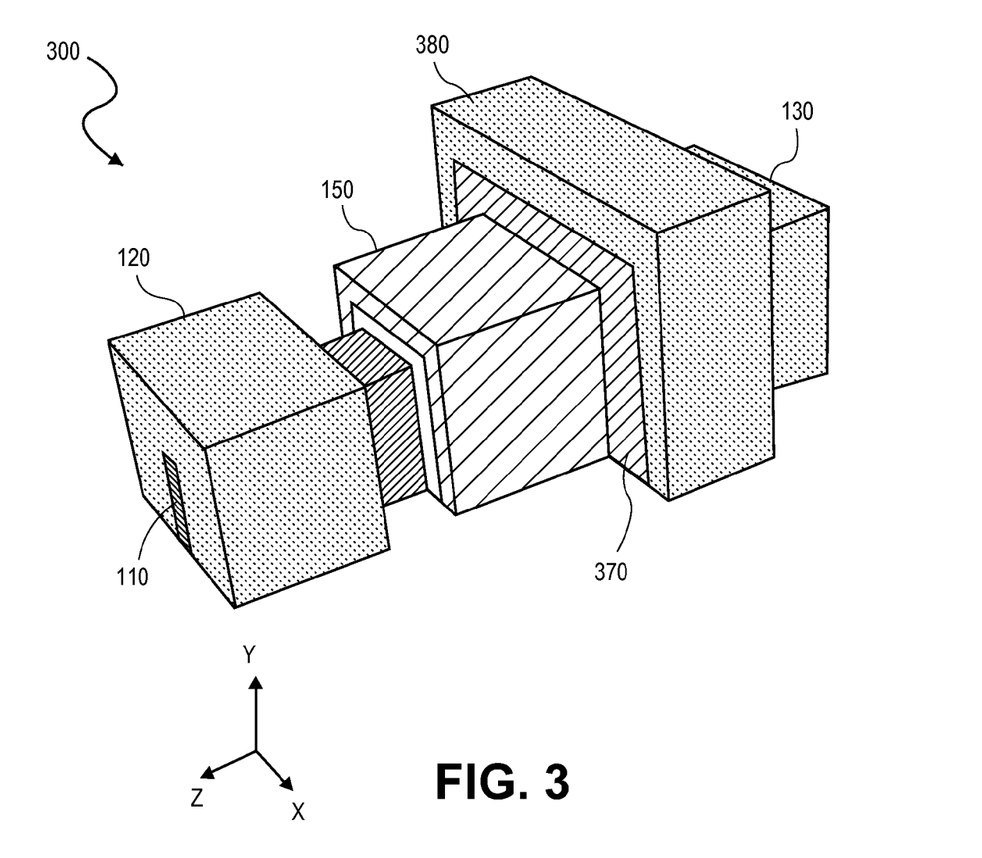
FIG. 3 is a isometric illustration of a non-planar III-N transistor, in accordance with an embodiment.

FIG. 3 is a isometric illustration of a non-planar III-N transistor 300, in accordance with an embodiment. Generally, the non-planar III-N transistor 300 includes any and all the features described in the context of the non-planar group III-nitride transistor 100 and may indeed be the non-planar III-N transistor 100 after further fabrication operations. As shown, the non-planar III-N transistor 300 further includes a non-planar field plate structure disposed over the non-planar polar crystalline semiconductor body 110, along a longitudinal length of the body between the drain region 130 and the gate structure including the conductive gate material 150. The non-planar field plate structure is disposed over both the first sidewall 110A and the second sidewall 110B to wrap around more than one surface of the non-planar polar crystalline semiconductor body 110 along the extrinsic region 135 (FIG. 1A). The non-planar field plate structure is to reduce the concentration of electric field near the surface and edges of the gate structure by provide a voltage potential plane (e.g., grounded) and provide increased breakdown voltage. The non-planar architecture enables multiple planes at the reduced potential (e.g., ground) providing a large area for a wider, more uniform distribution of the electric field developed between the drain region 130 and the channel region 145 at the edge of the conductive gate material 150 most proximate to the drain region 130.

The non-planar field plate structure generally includes a dielectric layer 370 disposed over the extrinsic region (e.g., on the second crystalline semiconductor layer 160) and overlapping onto the drain region 130 (e.g., on drain metallization) and overlapping onto the gate structure (e.g., on the conductive gate material 150). Generally, the dielectric layer 370 may be any conventional dielectric material. Exemplary materials include, but are not limited to, nitrides (e.g., $Si_xN_y$), oxides such as $SiO_2$ and $Al_2O_3$, high K dielectrics like $Gd_2O_3$, $HfO_2$, high K silicates like HfSiO, TaSiO, AlSiO, and oxynitrides like HfON, SiON, AlON, ZrSiON, HfSION, and group III-ON. Completing the non-planar field plate structure is the conductive field plate material 380, which may be any of the materials employed for the conductive gate material 150, polysilicon, or backend metallization, such as copper interconnect stacks, etc. To provide the most improvement in breakdown voltage, the conductive gate material 150 is to be disposed along both sidewalls 110A and 110B within the extrinsic region of the non-planar III-N transistor 300.

Group III-nitride semiconductor materials employed in the electronic devices described herein lack a cost-effective native substrate as starts for high quality epitaxial growth. Hence, the growth of the crystalline group III-nitride materials employed in the embodiments of the present invention may be grown on foreign substrates such as silicon carbide (SiC), sapphire, or as in the exemplary embodiment, silicon (Si). Silicon is an attractive substrate for GaN because of the availability of affordable large diameter substrates, and the ability to support Si FETs for CMOS integration.

The quality of epitaxial growth of III-nitrides is largely determined by the symmetry of the underlying substrate, as well as the lattice constants mismatch. As illustrated in FIG. 2A, for the exemplary group III-nitride (GaN) the crystal structure is wurtzite. The lattice constant a is relatively small (~3.189 Å), and therefore the mismatch to conventional (110) silicon substrates is large (~41% to both (001) and (110) planes having a lattice constant a of ~5.43 Å). Because the silicon (111) plane has a lattice parameter of 3.84 Å, it has a smaller mismatch of to GaN (~17%). Therefore, better quality GaN films have been epitaxially grown on (111) silicon substrates. Unfortunately, (111) silicon substrates are much more expensive and indeed currently limited in size to only 200 mm. Such a limitation in substrate size is not merely a significant disadvantage with respect to cost per device fabricated, but may foreclose the possibility of employing the most advanced fabrication techniques to form the non-planar group III-nitride transistors as the equipment for advanced CMOS processing is generally engineered only to handle the standard dimensioned silicon substrates used in silicon FET fabrication for CMOS technology (e.g., currently 300 mm).

Figure 4:
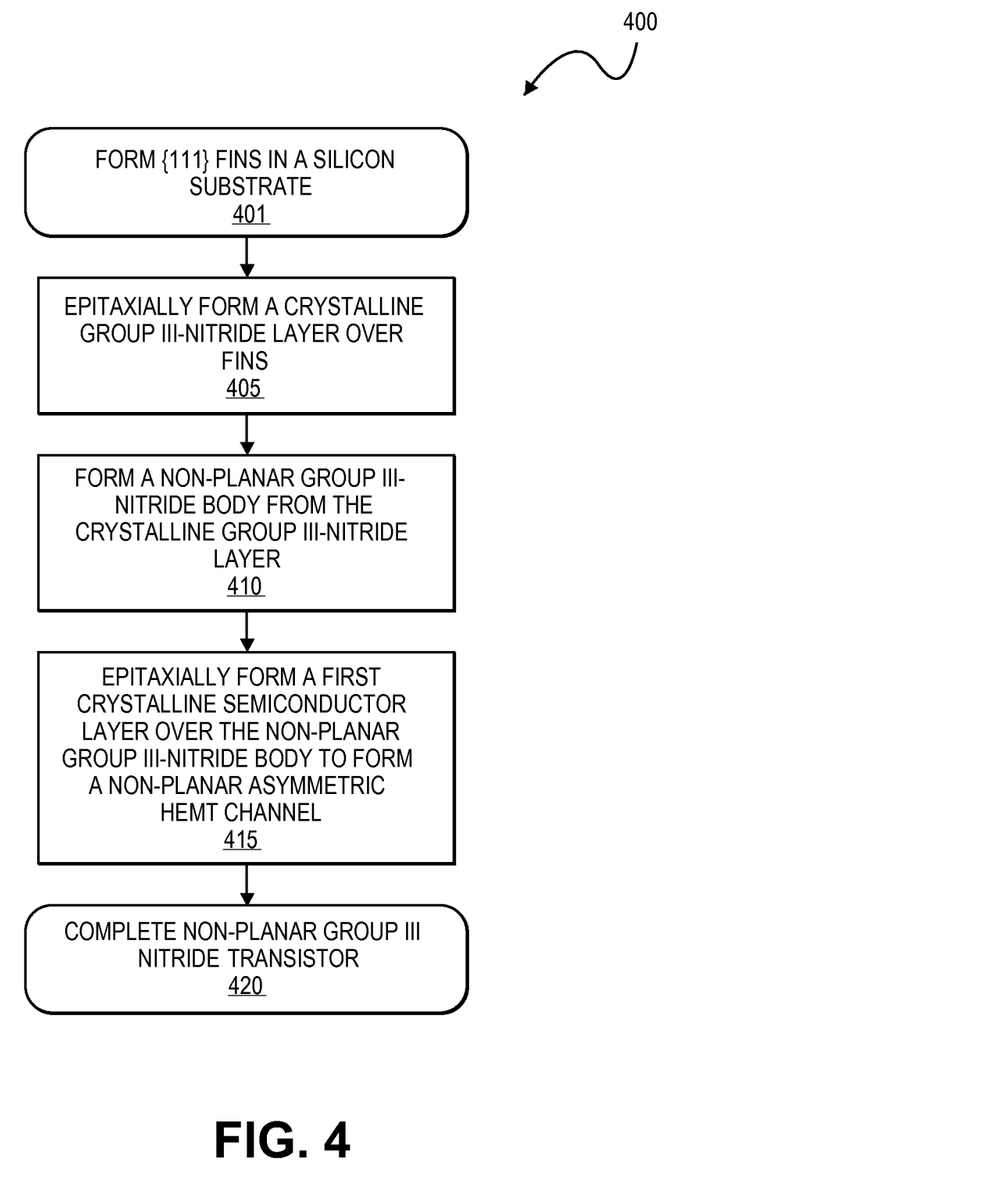
FIG. 4 is a flow diagram illustrating a method of fabricating a non-planar III-N transistor, in accordance with an embodiment.

As was illustrated in FIGS. 2A, 2B and 2C however, the non-planar polar crystalline semiconductor body 110 is to employ the wurtzite crystal structure oriented such that the (0001) and (000$\bar{1}$) planes form sidewalls of the non-planar body, leaving the top surface 110C to be the (10$\bar{1}$0) plane. For the exemplary material (GaN), the lattice parameter c is ~5.185 Å which is reasonably lattice matched to the Si (110) plane. Therefore, in the exemplary embodiment where a GaN non-planar polar crystalline semiconductor body 110 is to be formed, a GaN layer having the wurtzite crystal orientated for a (10$\bar{1}$0) plane is grown over a (110) silicon substrate (e.g., 300 mm diameter wafer). FIG. 4 is a flow diagram illustrate one such fabrication method.

In an embodiment, template etching of the silicon substrate is performed to provide more than one silicon plane upon which the group III-nitride semiconductor layer is to be grown. This practice can overcome difficulty in setting the orientation of the wurtzite crystal when grown on (110) silicon. For the exemplary embodiment in the method 400, at least one fin having a sidewall surface including a (111) plane is provided at operation 401. Generally, any technique employed to form non-planar bodies in silicon substrate (e.g., such as those employed to fabricate non-planar multigate silicon finFETs) may be utilized at operation 401. For example, high aspect ratio plasma etch processing techniques may be employed. Known crystallographic wet etches may also follow such plasma etching.

Figure 5A:
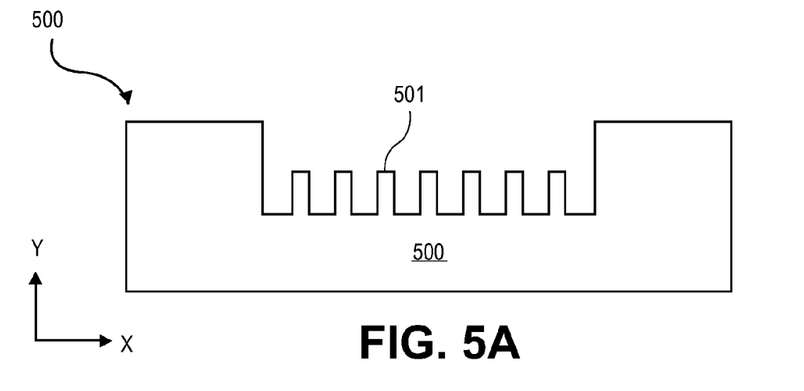
FIGS. 5A, 5B, 5C and 5D are cross-sectional illustrations of a substrate fabricated in preparation for forming a non-planar III-N transistor, in accordance with an embodiment.
Figure 6:
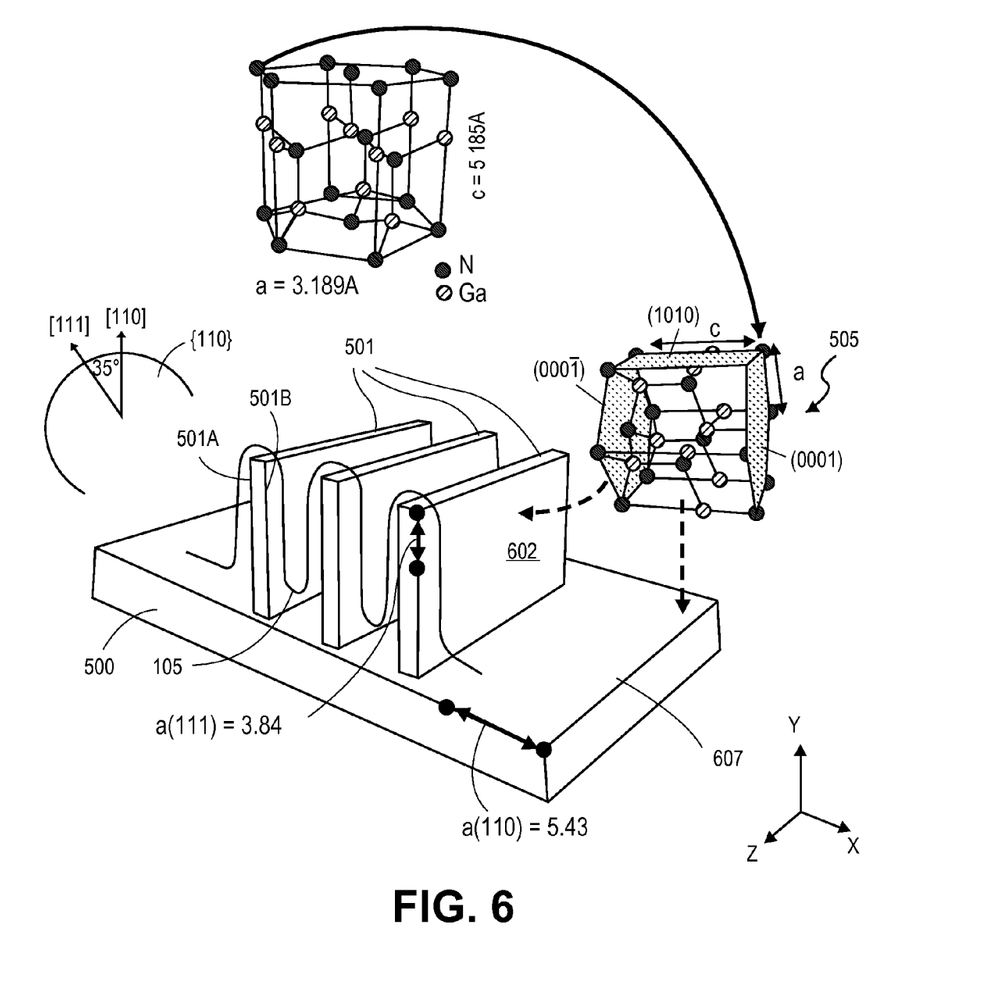
FIG. 6 is an isometric illustration of III-N semiconductor crystal polarity as grown on a single crystalline silicon substrate, in accordance with an embodiment.

FIG. 6 is an isometric illustration of III-N semiconductor crystal polarity as grown on a single crystalline silicon substrate, in accordance with an embodiment. As illustrated, matching between the wurtzite crystal planes and silicon crystal planes can be improved through orientation of a silicon fin 501 patterned into a large diameter (300 mm) silicon (110) substrate 500 to expose the silicon (111) plane on first and second opposite sidewalls 501A and 501B of the fin 501. As illustrated, by lithographically orientating the Si fins at 35° to the <110> crystal direction, the silicon fin sidewalls 110A and 110B exposed are along the (111) plane, having the lattice parameter of ~3.84 Å, which is better matched to the lattice parameter a of the (0001) and (000$\bar{1}$) planes of wurtzite (e.g., 3.189 Å for GaN). Similarly, the bottom silicon surface 607 (being on the (110) plane with lattice parameter of 5.43 Å) is better matched with the c parameter of the (10$\bar{1}$0) plane of wurtzite (e.g., 5.185 Å for GaN). The (110) substrate surface along with the template etched fin sidewall 402 serve to nucleate the wurtzite crystal 505 having the proper orientation. In an embodiment, a plurality of fins, each having a sidewall surface including a (111) plane is provided at operation 401, as illustrated in FIG. 6 and FIG. 5A. In embodiments, the plurality of non-planar silicon fins 501 have a width:height aspect ratio of between 1:1 and 1:10 and a pitch of between 50 nm and 1 µm. Such multi-fin structures, properly spaced, establish intervening deep trenches well suited to defect trapping.

Figure 5B:
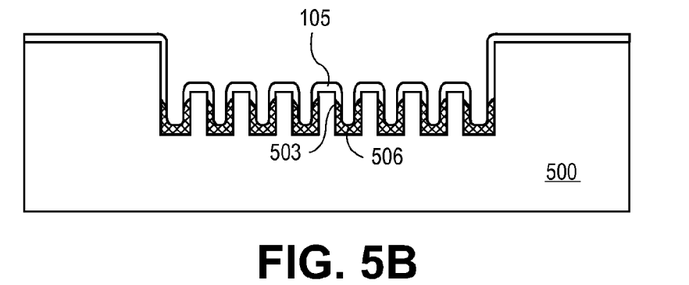
Figure 5C:
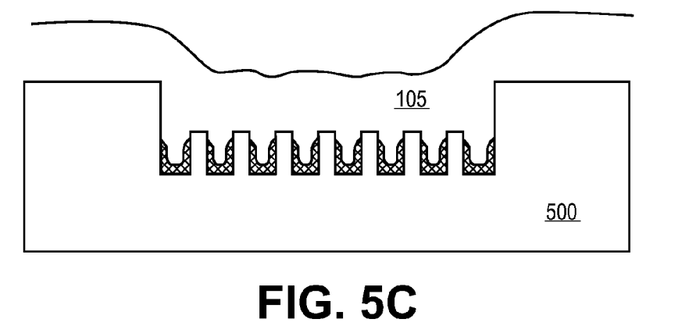
Figure 5D:
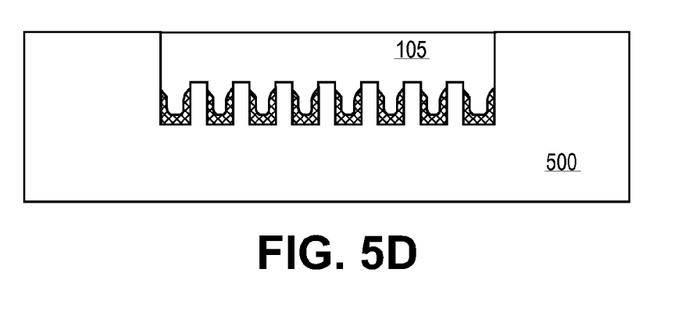

Returning to FIG. 4, at operation 405, a crystalline group III-nitride layer is epitaxially grown over the silicon fins. In the exemplary embodiment, a GaN layer is epitaxially grown with substantially no dopant (e.g., no silicon species) using any standard chemical vapor deposition (CVD), molecular beam epitaxy (MBE), hydride vapor phase epitaxy (HYPE) growth technique (with standard precursors, temperatures, etc.), or the like. The crystalline group III-nitride layer 105 grown directly on and between the silicon fins 501 is either the material from which the non-planar polar crystalline body 110 is to be formed, or is a buffer layer over which a device layer from which the non-planar polar crystalline body 110 is to be formed. As further shown in FIG. 5B, the crystal dislocations 506 within the crystalline group III-nitride layer 105 are generally surface seeking, such that they run until encountering a fin sidewall 503. As the thickness of the crystalline group III-nitride layer 105 increases (e.g., FIG. 5C), there is a reduction of defect density in the device layers above the silicon fins 501. As further illustrated by FIG. 5D, the exemplary embodiment with the silicon fins 501 having a pitch and aspect ratio optimized for epitaxy of the group III-nitride, the plurality of silicon fins 501 may be recessed into the silicon fins 501 so that a polish of the epitaxial overburden may be performed to provide a planar group III-nitride surface into which the group III-nitride transistor describe herein will be formed. In the exemplary embodiment, the crystalline group III-nitride layer 105 is planarized with a top surface of the silicon substrate 500 remaining in regions external to those where the group III-nitride transistors are to be formed, permitting their integration with silicon FETs for monolithic CMOS technology integration.

Returning to FIG. 4, at operation 410, one or more non-planar polar crystalline semiconductor body 110 is formed from the crystalline group III-nitride layer 105. Either a selective regrowth (additive processing) technique or a selective etch (subtractive processing) technique may be employed. For example a patterned mask (e.g., lithographically defined deposited oxide) may be formed over the crystalline group III-nitride layer 105 and a regrowth performed to form the non-planar polar crystalline semiconductor body 110. Alternatively, depending on the material composition, one or more of known plasma etch and wet chemical etches may be performed with regions of the crystalline group III-nitride layer 105 masked using known materials patterned by standard lithographic techniques. Sidewalls of the features etched into the crystalline group III-nitride layer 105 may be any of oxidized, cleaned and passivated using any technique convention in the for the group III-nitride material selected (e.g., GaN). As many such techniques have been developed for both optoelectronic and transistor fabrication, no further details are provided herein.

Figure 5E:
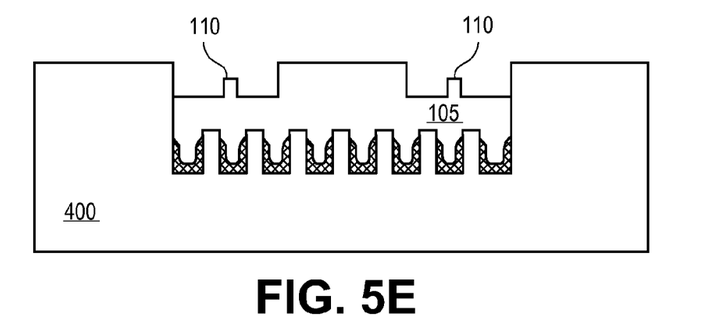
FIGS. 5E, 5F, and 5G are cross-sectional illustrations of a non-planar III-N transistor fabricated in accordance with an embodiment.
Figure 5F:
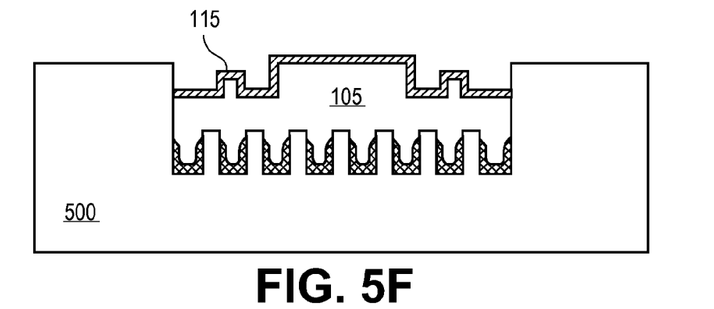
Figure 5G:
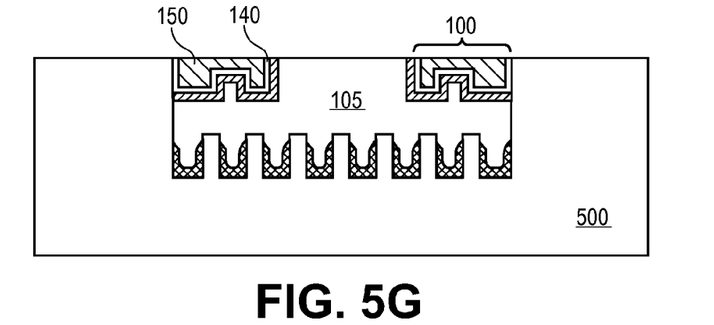

As further illustrated in FIG. 4, upon forming the non-planar polar crystalline semiconductor body 110, at operation 415 the first crystalline semiconductor layer 115 is epitaxially grown over (e.g., directly on) the non-planar polar crystalline semiconductor body 110 to have the properties described elsewhere herein in reference to FIG. 1A, for example. In the exemplary embodiment illustrated in FIG. 5F, a AlN layer is epitaxially grown with substantially no dopant (e.g., no silicon species) using standard chemical vapor deposition (CVD), molecular beam epitaxy (MBE), hydride vapor phase epitaxy (HVPE) growth techniques with standard precursors, temperatures, etc.). With the crystal orientation as provided in operation 405, the first crystalline semiconductor layer 115 forms a charge inducing layer on a first of the sidewalls of the non-planar polar crystalline semiconductor body 110 (e.g., a HEMT) channel and a back barrier on a second sidewall of the non-planar polar crystalline semiconductor body 110.

Completing FIG. 4, at operation 420 the non-planar group III-nitride transistor is completed. In the exemplary embodiment illustrated in FIG. 5E, a gate dielectric material 104 is formed using a technique conventional for the material selected. For example a CVD, or more specifically, an atomic layer deposition (ALD), technique known in the art may be utilized to cover the first crystalline semiconductor layer 115 with any of the dielectric materials described elsewhere herein for the gate dielectric material 104. Subsequently, the conductive gate material 150 may be deposited over the gate dielectric material 104 using any conventional deposition process, such as, but not limited to, physical vapor deposition (PVD), CVD, electroplating, and electroless plating. Again, any of the conductive gate material 150 describe elsewhere herein may be utilized. The non-planar group III-nitride transistor 100 is completed by forming the source and drain regions 120, 130 (depicted in FIG. 1A) using any of the epitaxial regrowth techniques previously described, but with in-situ doping (e.g., silicon). For example, n+ doped group III-nitride may be epitaxially grown on sidewalls and a top surface at the opposite ends of a non-planar GaN body. Contact metallization may also use standard techniques. As will be appreciated by those of skill in the art, the sequence of forming a transistor channel region, including the gate structure, and an extrinsic region, including the source and drain regions may vary, and therefore the order of the fabrication operations described and illustrated in the FIGS. 4 and 5A-5H may be readily modified without deviating from the broader scope and spirit of the embodiments of the present invention.

Figure 5H:
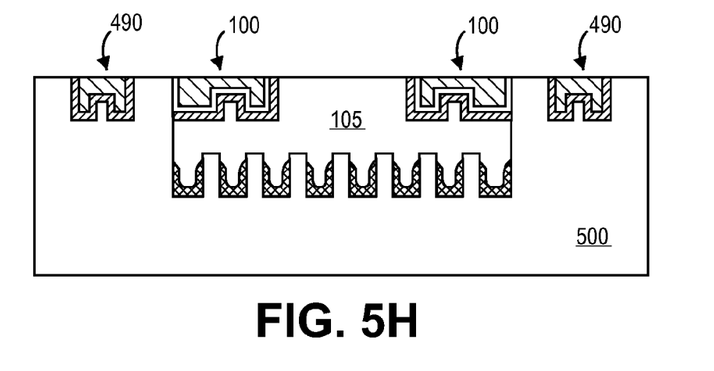
FIG. 5H is a cross-sectional illustration of a silicon non-planar transistor fabricated with the non-planar III-N transistor fabricated in FIGS. 5E, 5F, and 5G in accordance with an embodiment.

Finally, in the particular embodiment illustrated in FIG. 5H, silicon field effect transistors (FETs) 490 are fabricated into the silicon substrate 500 adjacent to the non-planar group III-nitride transistor 100 to monolithically integrate scalable high frequency, high voltage circuits comprising the non-planar group III-nitride transistor 100 with advanced logic circuits comprising CMOS technology. As shown in FIG. 5H, the silicon FETs 490 are also non-planar, and as such may be fabricated in a manner other than completely serially with fabrication of the non-planar group III-nitride transistor 100 (e.g., not fabricated after completion of the non-planar group III-nitride transistor 100), but rather the differing transistor technologies may be fabricated in parallel to some extent. For example, a replacement gate process may be utilized for both the group III-nitride transistor 100 and the silicon FETs 490 such that a sacrificial gate formed in each is replaced at the same time with a final gate metallization. Once transistor-level monolithic integration is complete, circuit fabrication may be completed using any interconnection process suitable for silicon CMOS technology. Packaging and assembly into a device, such as a mobile computing platform, may then proceed conventionally.

Figure 7:
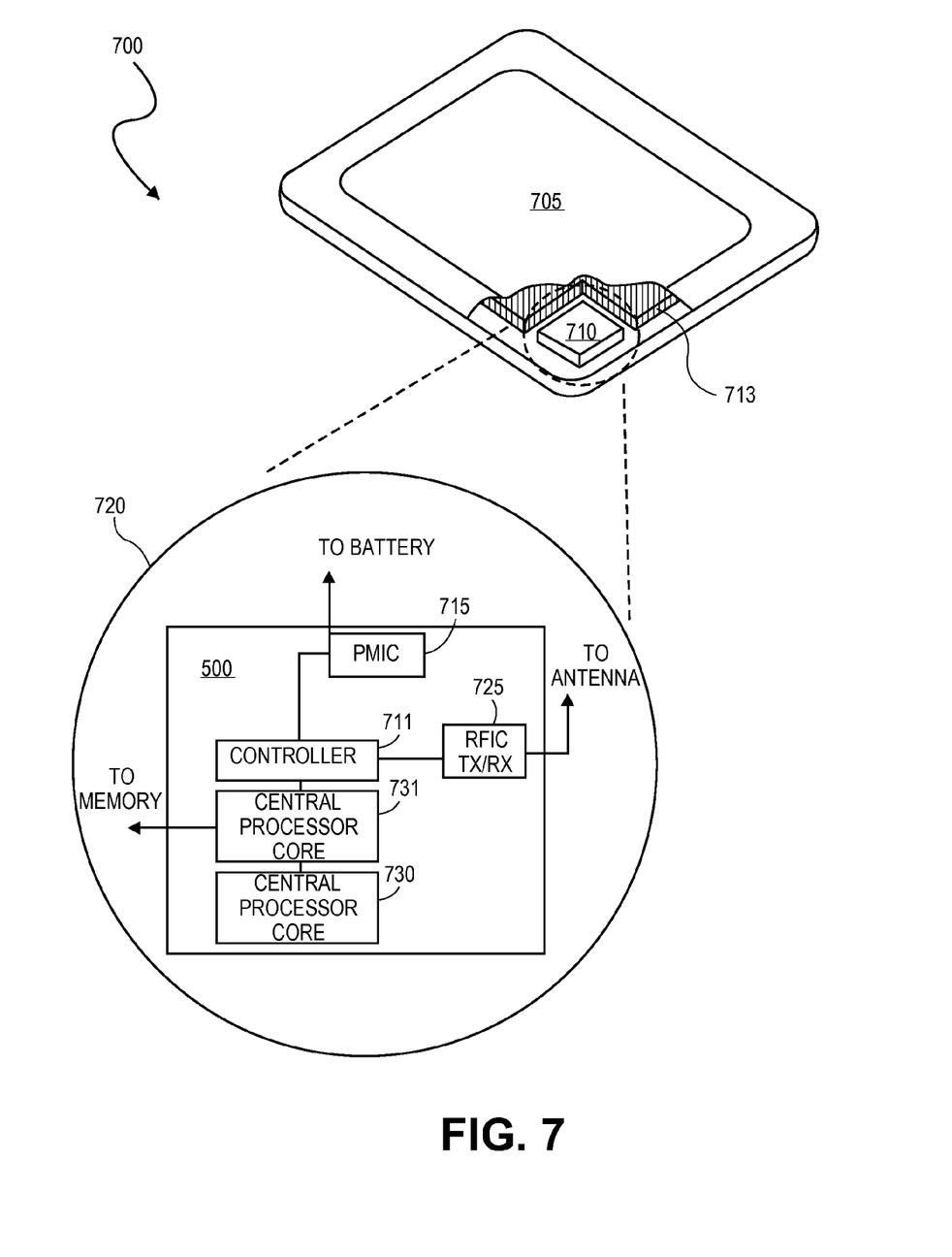
FIG. 7 is a functional block diagram of an SOC implementation of a mobile computing platform, in accordance with an embodiment of the present invention.

FIG. 7 is a functional block diagram of a SOC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 that is in one embodiment a touch screen (e.g., capacitive, inductive, resistive, etc.) for receipt of user input, the SOC 710, and a battery 713. As illustrated, the greater the level of integration of the SOC 710, the more of the form factor within the mobile computing platform 700 that may be occupied by the battery 713 for longest operative lifetimes between charging, or occupied by memory (not depicted), such as a solid state drive for greatest functionality.

Depending on its applications, mobile computing platform 700 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SOC 710 is further illustrated in the expanded view 720. Depending on the embodiment, the SOC 710 includes a portion of the silicon substrate 500 (i.e., a chip) upon which two or more of a power management integrated circuit (PMIC) 715, RF integrated circuit (RFIC) 725 including an RF transmitter and/or receiver, a controller thereof 711, and one or more central processor core 730, 731 is fabricated. The RFIC 725 enables wireless communications for the transfer of data to and from the computing platform 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 715 and RFIC 725, which typically utilize LDMOS and III-V HBT technologies, respectively. In embodiments of the present invention however, the PMIC 715 and RFIC 725 employ the transistors described herein (e.g., non-planar group III-nitride transistor 100) integrated with one or more of the controller 711 and processor cores 720, 730 provided in silicon CMOS technology monolithically integrated with the PMIC 715 and/or RFIC 725 onto the silicon substrate 500. It will be appreciated that within the PMIC 715 and/or RFIC 725, the high voltage, high frequency capable transistors described herein need not be utilized in exclusion to CMOS, but rather silicon CMOS may further be included in each of the PMIC 715 and RFIC 725. The non-planar group III-nitride transistors may be specifically utilized where a high voltage swings present (e.g., 7-10V battery power regulation, DC-to-DC conversion, etc. within the PMIC 715) and/or where large power added efficiency (PAE) is needed from a power amplifier transistor having an $F_t$ of at least ten times carrier frequency (e.g., a 1.9 GHz in an RFIC 725 designed for 3G or GSM cellular communication). As illustrated, in the exemplary embodiment the PMIC 715 has an input coupled to the battery 713 and has an output provide a current supply to all the other functional modules in the SOC 710. In a further embodiment, where additional ICs are provided within the mobile computing platform 700 but off the SOC 710, the PMIC 715 output further provides a current supply to all these additional ICs off the SOC 710. As further illustrated, in the exemplary embodiment the RFIC 725 has an output coupled to an antenna and may further have an input coupled to a communication modules on the SOC 710, such as an RF analog and digital baseband module (not depicted). Alternatively, such communication modules may be provided on an IC off-chip from the SOC 710 and coupled into the SOC 710 for transmission.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A high electron mobility transistor (HEMT), comprising:
   a non-planar, polar crystalline semiconductor body on a substrate, the non-planar polar crystalline semiconductor body having a top surface disposed between first and second opposite sidewalls;
   a first crystalline semiconductor layer disposed over the first and second sidewalls;
   a source and drain region at opposite ends of the non-planar, polar crystalline semiconductor body with a channel region disposed therebetween; and
   a gate structure disposed over the first crystalline semiconductor layer along at least the second sidewall wherein current flow through the channel region is in a direction parallel to the substrate.

2. The HEMT of claim 1, wherein the first crystalline semiconductor layer is to provide a back barrier with a heterojunction formed along the first sidewall, and to provide a two dimensional electron gas (2DEG) within a channel region of the non-planar, polar crystalline semiconductor body with a heterojunction along the second sidewall.

3. The HEMT of claim 2, wherein the gate structure is further disposed over the first crystalline semiconductor layer along the first sidewall to gate the back barrier.

4. The HEMT of claim 2, wherein the polar crystal structure is wurtzite with the first sidewall comprising the (000$\bar{1}$) plane, the second sidewall comprising the (0001) plane.

5. The HEMT of claim 4, wherein the non-planar, polar crystalline semiconductor is a first group III-nitride, and wherein the first crystalline semiconductor layer comprises an epitaxial layer of a second group III-nitride having a larger bandgap than the first group III-nitride.

6. The HEMT of claim 5, wherein the group III-nitride comprises gallium (Ga), the GaN being undoped within the channel region, and wherein the second group III-nitride comprises at least aluminum (Al).

7. The HEMT of claim 1, a second crystalline semiconductor layer disposed over the polar crystalline semiconductor along lengths of the non-planar polar crystalline semiconductor body between the channel region and the source and drain regions, the second crystalline semiconductor layer being at least one of: a different material or a different thickness than the first crystalline semiconductor layer.

8. The HEMT of claim 1, further comprising a field plate structure disposed over the non-planar polar crystalline semiconductor body, along a longitudinal length between the drain and the gate structure, wherein the field plate structure is disposed over both the first sidewall and second sidewall and is coupled to ground potential.

9. The HEMT of claim 1, wherein the non-planar polar crystalline semiconductor body is disposed on a (110) plane of a silicon substrate.

10. A high electron mobility transistor (HEMT), comprising:

a non-planar, polar crystalline semiconductor body having a top surface disposed between first and second opposite sidewalls;

a first crystalline semiconductor layer disposed over the first and second sidewalls;

a source and drain region at opposite ends of the non-planar, polar crystalline semiconductor body with the channel region disposed therebetween; and a gate structure disposed over the first crystalline semiconductor layer along at least the second sidewall, a field plate structure disposed over the non-planar polar crystalline semiconductor body, along a longitudinal length between the drain and the gate structure, wherein the field plate structure is disposed over both the first sidewall and second sidewall and is coupled to ground potential.

* * * * *